(12) United States Patent  
Kanakasabapathy et al.

(10) Patent No.: US 7,112,861 B2
(45) Date of Patent: Sep. 26, 2006

(54) MAGNETIC TUNNEL JUNCTION CAP STRUCTURE AND METHOD FOR FORMING THE SAME

(75) Inventors: Sivananda K. Kanakasabapathy, Hopewell Junction, NY (US); David W. Abraham, Croton on Hudson, NY (US); Ulrich Klostermann, Fontainebleau (FR)

(73) Assignee: International Business Machines Corporation, Armonk, NY (US)

( * ) Notice: Subject to any disclaimer, the term of this patent is extended or adjusted under 35 U.S.C. 154(b) by 239 days.

(21) Appl. No.: 10/709,573

(22) Filed: May 14, 2004

(65) Prior Publication Data

US 2005/0254180 A1    Nov. 17, 2005

(51) Int. Cl.
    *G01R 33/09* (2006.01)
(52) U.S. Cl. ............................. 257/421; 257/E29.323; 438/3
(58) Field of Classification Search ................ 257/421, 257/E29.323
    See application file for complete search history.

(56) References Cited

U.S. PATENT DOCUMENTS

| 6,211,090 | B1 | 4/2001 | Durlam et al. |
|---|---|---|---|
| 2003/0076703 | A1 | 4/2003 | Kim et al. |
| 2003/0181056 | A1 | 9/2003 | Kumar et al. |
| 2003/0199104 | A1 | 10/2003 | Leuschner et al. |
| 2003/0206434 | A1 | 11/2003 | Leuschner |
| 2003/0207486 | A1 | 11/2003 | Deak |
| 2005/0102720 | A1* | 5/2005 | Lee ..................... 977/DIG. 1 |
| 2005/0191764 | A1* | 9/2005 | Yates et al. .................... 438/3 |

* cited by examiner

*Primary Examiner*—Asok Kumar Sarkar
(74) *Attorney, Agent, or Firm*—Lisa Jaklitsch; Cantor Colburn LLP

(57) ABSTRACT

A a magnetic random access memory (MRAM) device includes a cap layer formed over a magnetic tunnel junction (MTJ) stack layer, an etch stop layer formed over the first cap layer, and a hardmask layer formed over the etch stop layer. The etch stop layer is selected from a material such that an etch chemistry used for removing the hardmask layer has selectivity against etching the etch stop layer material.

6 Claims, 2 Drawing Sheets

MAGNETIC TUNNEL JUNCTION CAP STRUCTURE AND METHOD FOR FORMING THE SAME

BACKGROUND OF INVENTION

The present invention relates generally to semiconductor manufacturing processes, and, more particularly, to an etch stop layer for a magnetic tunnel junction (MTJ) cap structure, and method for patterning an MTJ stack using the same.

Magnetic (or magneto-resistive) random access memory (MRAM) is a non-volatile random access memory technology that could potentially replace the dynamic random access memory (DRAM) as the standard memory for computing devices. The use of MRAM as a non-volatile RAM will eventually allow for "instant on" systems that come to life as soon as the system is turned on, thus saving the amount of time needed for a conventional PC, for example, to transfer boot data from a hard disk drive to volatile DRAM during system power up.

A magnetic memory element (also referred to as a tunneling magneto-resistive, or TMR device) includes a structure having ferromagnetic layers separated by a non-magnetic layer (tunnel barrier), and arranged into a magnetic tunnel junction (MTJ). Digital information is stored and represented in the memory element as directions of magnetization vectors in the magnetic layers. More specifically, the magnetic moment of one magnetic layer (also referred to as a reference layer) is fixed or pinned, while the magnetic moment of the other magnetic layer (also referred to as a "free" layer) may be switched between the same direction and the opposite direction with respect to the fixed magnetization direction of the reference layer. The orientations of the magnetic moment of the free layer are also known as "parallel" and "antiparallel" states, wherein a parallel state refers to the same magnetic alignment of the free and reference layers, while an antiparallel state refers to opposing magnetic alignments therebetween.

In newer MRAM devices, the free layer may be a loosely coupled, synthetic anti-ferromagnet having a pair of anti-parallel ferromagnetic films sandwiched around a nonmagnetic spacer material of appropriate thickness. The reference layer may still be a single ferromagnetic film or a synthetic anti-ferromagnetic sandwich. In either case, the orientation of the free layer adjacent to the tunnel barrier with respect to the reference layer adjacent to the tunnel barrier determines the magnetic state of the tunnel junction.

Depending upon the magnetic state of the free layer (parallel or antiparallel), the magnetic memory element exhibits two different resistance values in response to a voltage applied across the tunnel junction barrier. The particular resistance of the TMR device thus reflects the magnetization state of the free layer, wherein resistance is "low" when the magnetization is parallel, and "high" when the magnetization is antiparallel. Accordingly, a detection of changes in resistance allows a MRAM device to provide information stored in the magnetic memory element (i.e., a read operation). The localized magnetic field generated by the passage of currents is used to align the free and reference layers to align either parallel or anti-parallel, thereby writing the bit.

In the processing and patterning of an MTJ stack, several different materials are used. For example, a lower metallization level is formed within an interlevel dielectric material (such as through well-known damascene processing techniques) to form conductive lines, followed by formation of the magnetic stack materials over the conductive lines. Again, the MTJ typically includes an antiferromagnetic layer such (but not limited to) PtMn and IrMn. On top of this pinning layer, a reference layer is deposited that typically consists of thin films of ferromagnetic alloys such as (but not limited to) NiFe and CoFe with nonmagnetic spacers of (but not limited to) Ru, Re, Os, Nb, Cr or alloys thereof. A tunnel layer such as $Al_2O_3$, for example, is deposited, followed by a free layer comprising thin films of ferromagnetic alloys such as (but not limited to) NiFe and CoFe. Again, the free layer may have two ferromagnetic films with non-magnetic spacers such as Ru, Re, Os, Nb, Cr or alloys thereof. Those skilled in the art also recognize that the order of the magnetic stack materials may be reversed. That is, the reference layer may be on top of the stack, and the free layer may be underneath the tunnel layer.

In any case, the resulting MTJ stack is then provided with a protective cap layer formed thereupon, typically at a thickness of about a few hundred angstroms. The cap layer is typically formed from a conductive material such as tantalum (Ta), tantalum nitride (TaN) or titanium nitride (TiN) that protects the magnetic stack materials from exposure to the ambient. Then, a hardmask layer is formed over the cap layer for subsequent opening and patterning of the MTJ stack materials. It is desirable in integration schemes involving highly scaled-down tunnel junctions to have a self-aligned, conductive stud (e.g., around 1000 angstroms thick) used to make contact with upper level bitline wiring. The self-alignment of the stud to the tunnel junction is realized by using a conductive metal as a hardmask in the etching of the tunnel junction. However, in conventional processing, the material used for the hardmask layer is the same or similar (e.g., Ta, TaN, TiN) to the material used for the cap layer. As such, there is generally poor etch selectivity of the hardmask layer with respect to the cap layer, and thus stopping the hardmask etch on the cap layer is problematic.

Accordingly, it would desirable to be able to provide a cap structure that has etch selectivity with respect to an overlying hardmask, so as to allow for a separate etch of the cap structure that will stop on the magnetic free layer of the MTJ stack and will be substantially non-corrosive thereto.

SUMMARY OF INVENTION

The foregoing discussed drawbacks and deficiencies of the prior art are overcome or alleviated by a cap structure for a magnetic random access memory (MRAM) device. In an exemplary embodiment, the cap structure includes a cap layer formed over a magnetic tunnel junction (MTJ) stack layer, an etch stop layer formed over the first cap layer, and a hardmask layer formed over the etch stop layer. The etch stop layer is selected from a material such that an etch chemistry used for removing the hardmask layer has selectivity against etching the etch stop layer material.

In another embodiment, a cap structure for a magnetic random access memory (MRAM) device includes a first cap layer formed over a magnetic tunnel junction (MTJ) stack layer, an etch stop layer formed over the first cap layer, a second cap layer formed over the etch stop layer, and a hardmask layer formed over the etch stop layer. The etch stop layer is selected from a material such that an etch chemistry used for removing both the hardmask layer and the second cap layer has selectivity against etching the etch stop layer material.

In still another embodiment, a method for opening a hardmask layer of a magnetic random access memory (MRAM) device includes patterning a photoresist layer formed over the hardmask layer and implementing a first etch process to remove exposed portions of the hardmask layer. The first etch process terminates on an etch stop layer formed over a first cap layer, the first cap layer in turn formed over a magnetic tunnel junction (MTJ) stack layer. The etch stop layer formed over said first cap layer is removed, and a second etch process is implemented to remove exposed portions of the first cap layer, the etch process terminating on an upper magnetic layer of the MTJ stack layer.

BRIEF DESCRIPTION OF DRAWINGS

Referring to the exemplary drawings wherein like elements are numbered alike in the several Figures.

DETAILED DESCRIPTION

Disclosed herein is a novel cap structure for an MTJ stack that provides etch selectivity with respect to an overlying hardmask for a two-stage, hardmask open step. Briefly stated, the cap structure features a first cap layer followed by a nonmagnetic, electrically conductive etch stop layer over the first cap layer. Optionally, a second cap layer (which may be of the same material as the first cap layer) is be formed over the etch stop layer to complete the cap structure, prior to formation of the hardmask thereon. Thus configured, the cap structure allows for a first etch to remove the exposed hardmask material (and optional second cap layer) while stopping on the etch stop layer. After the etch stop layer is removed, a second etch (of differing chemistry with respect to the first etch) is used to remove the first cap layer and stop on the upper layer of the MTJ stack.

Figure 1:
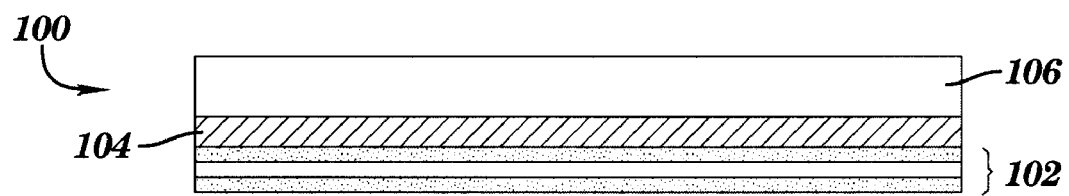
FIG. 1 is a cross sectional view of an existing cap structure and hardmask formed over an MTJ stack.

Referring initially to FIG. 1, there is shown a cross sectional view of an existing cap structure 100 and hardmask formed over an exemplary MTJ stack. As is shown, an MTJ stack, collectively denoted at 102, includes a first magnetic layer (such as PtMn, CoFe, Ru and NiFe, for example), a dielectric layer (such as $Al_2O_3$, for example) and a second magnetic layer. It should be noted that the particular makeup of the MTJ stack shown in FIG. 1 is exemplary only, and that the present invention embodiments are equally applicable to other types of MTJ stacks having one or more ferromagnetic layers associated with the free and reference layers thereof and including, but not limited to, those types of MTJ structures discussed previously. Formed atop MTJ stack 102 is a cap layer 104 that typically includes a conductive material such as tantalum nitride (TaN) or titanium nitride (TiN) that protects the magnetic stack materials from oxidation. A hardmask 106 is formed over the cap layer 104 and, as indicated previously, is typically a material (TaN, TiN) that is not etch selective with respect to the cap layer 104. As such, the opening of the hardmask layer 106 by reactive ion etching (RIE) is timed or based on endpoint detection.

Figure 2:
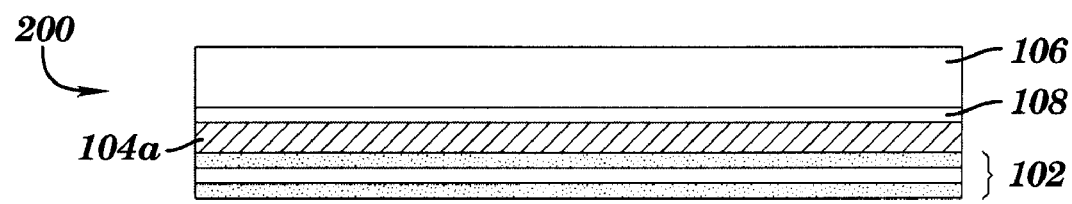
FIG. 2 is a cross sectional view of a cap structure and hardmask formed over an MTJ stack; in accordance with an embodiment of the invention.

Therefore, in accordance with an embodiment of the invention, there is disclosed a novel cap structure 200 for an MTJ stack 102 that provides etch selectivity with respect to an overlying hardmask 106 for a two-stage, hardmask open step. As illustrated in FIG. 2, the cap structure, in addition to a first cap layer 104a, has a thin etch stop layer 108 formed thereupon. The etch stop layer 108 is selected so as to be resistant to chemical etching under relatively low biasing power levels and, particularly, so as not to be corroded by chlorine or bromine based chemistries. Furthermore, the etch stop layer 108 is nonmagnetic and sputterable in a chemistry (e.g., oxygen) that will allow selective stopping on the first cap layer 104a. Accordingly, suitable examples of the etch stop layer 108 include, but are not limited to, aluminum, copper, platinum, manganese platinum, iridium, iridium manganese, chromium, chromium molybdenum and ruthenium.

Figure 3:
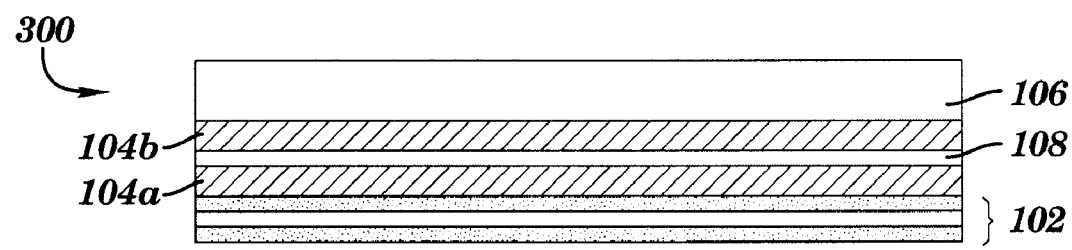
FIG. 3 is a cross sectional view of an alternative embodiment of the cap structure of FIG. 2.

Once the etch stop layer 108 is formed over the first cap layer 104a, the hardmask layer 106 may be formed directly over the etch stop layer 108. In an alternative embodiment, FIG. 3 illustrates a cap structure 300 wherein, in addition to first cap layer 104a and etch stop layer 108, a second cap layer 104b is formed over the etch stop layer 108. Such an embodiment may be desired, for example, in the event that contamination of the hardmask deposition tool were an issue, and/or if adhesion of the hardmask layer 106 directly to the etch stop layer 108 were an issue. Essentially, the etch stop layer 108 of cap structure 300 is sandwiched between the first and second cap layers 104a, 104b. Again, in this embodiment, the etch stop layer 108 is resistant to halogen chemistry etching that is used to etch the hardmask material 106 and (due to the poor etch selectivity) the material of the second cap layer 104b (e.g., TaN).

Figure 4A:
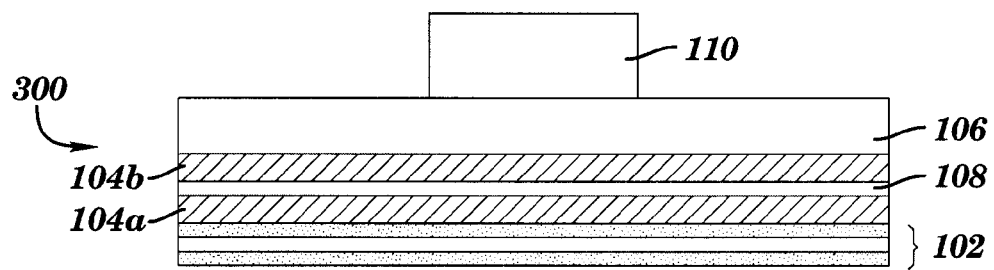
FIGS. 4(a) through 4(d) are cross sectional views of a two-stage method for opening a hardmask formed over an MTJ stack and cap structure, in accordance with a further embodiment of the invention.
Figure 4B:
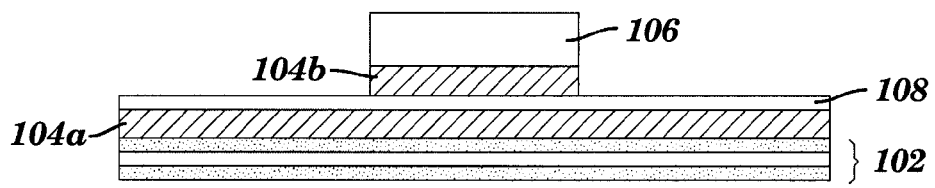

Referring now to FIGS. 4(a) through 4(d), there is shown an exemplary processing sequence that employs a two-stage hardmask opening sequence using the cap structure embodiment 300 of FIG. 3 described above. However, the processing sequence is equally applicable to the embodiment of FIG. 2, which does not employ a second cap layer. In FIG. 4(a), a photoresist material 110 formed on the hardmask layer 106 is developed into the desired hardmask pattern. Using the photoresist pattern, the exposed hardmask material is removed using an etch chemistry that is not selective to the material used for the second cap layer 104b. Thus, the endpoint of the first etch is reached by stopping on the etch stop layer 108, as shown in FIG. 4(b). The result is the same even for the cap structure embodiment 200 where a second cap layer is not used. In that case, the first etch process would remove the exposed hardmask material and then stop once the etch stop layer 108 is reached. Then, the patterned photoresist material 110 is removed and the device may be rinsed in deionized water (and/or acid based, aqueous solutions for post-etch polymer removal such as dilute hydrofluoric acid, for example) to wash away the residue.

Figure 4C:
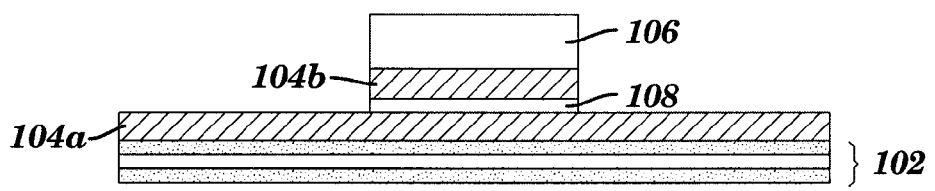
Figure 4D:
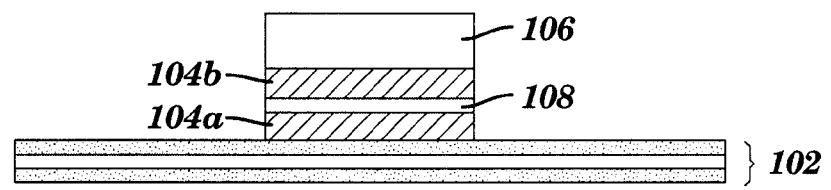

As shown in FIG. 4(c), the newly exposed portions of etch stop layer 108 are removed by an oxygen based sputter (e.g., $CO/NH_3$) that will selectively stop on the first cap layer 104a. Another deionized water (and/or acid based aqueous solution) rinse may be used at this point to remove resulting residue. Finally, as shown in FIG. 4(d), the first cap layer 104a is removed using a non-polymerizing, fluorine based chemical etch (e.g., $NF_3$) at a relatively low bias power so as to stop on the top of the MTJ stack layer 102.

As will be appreciated, the use of the etch stop layer 108 allows for a fluorine based chemical etch removal of a cap layer formed directly atop the free layer of the MTJ stack layer 102. In terms of potential damage to the magnetic properties of the free layer, a fluorine based removal chemistry has been shown to be superior to a chlorine based removal chemistry. In the removal of an exemplary TaN cap layer of about 100 angstroms in thickness, both chlorine and fluorine chemistries had comparable removal times (about 15 seconds, 18 seconds, respectively). However, with a chlorine chemistry, once the magnetic free layer was exposed, the corrosion of the magnetic film by the chlorine resulted in a dramatic increase in the value of the applied magnetic field needed to switch the magnetic moment. Thus, such corrosion adversely impacts the performance of an MRAM device, in terms of the ability to write data into the memory with relatively low applied currents. On the other hand, the exposure of the free layer to the fluorine chemistry following cap removal has significantly less impact on the free layer in terms of the increase in applied magnetic field needed for magnetic moment switching.

However, in terms of hardmask opening, a fluorine chemistry has virtually no selectivity with respect to a photoresist mask and chemically etches titanium nitride at a much slower rate than does a chlorine chemistry. Thus, in this case, it is still desirable to implement a thick hardmask opening step with a chlorine based chemistry. Furthermore, given the incorporation of the etch stop layer 108 described herein, the chlorine based chemistry may be used without the disadvantage of magnetic layer corrosion.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A cap structure for a magnetic random access memory (MRAM) device, comprising:
    a first cap layer formed over a magnetic tunnel junction (MTJ) stack layer;
    an etch stop layer formed over said first cap layer, said etch stop layer comprising a nonmagnetic, electrically conductive material;
    a second cap layer formed over said etch stop layer; and
    a hardmask layer formed over said second cap layer;
    wherein said etch stop layer is selected from a material such that an etch chemistry used for removing both said hardmask layer and said second cap layer has selectivity against etching said etch stop layer material.

2. The cap structure of claim 1, wherein said etch stop layer further comprises at least one of: aluminum, copper, platinum, manganese platinum, iridium, iridium manganese, chromium, chromium molybdenum and ruthenium.

3. The cap structure of claim 1, wherein said etch stop layer is removable using an oxygen based etch chemistry.

4. The cap structure of claim 1, wherein:
    said etch stop layer is selected to be corrosion resistant with respect to halogen based etch chemistries; and
    said etch stop layer is further selected to be resistant to post-etch, aqueous cleaning processes.

5. The cap structure of claim 1, wherein said first cap layer further comprises at least one of: tantalum, tantalum nitride and titanium nitride.

6. The cap structure of claim 1, wherein said hardmask layer further comprises at least one of: tantalum, tantalum nitride and titanium nitride.

* * * * *